United States Patent
Shin et al.

(10) Patent No.: US 11,075,340 B2
(45) Date of Patent: Jul. 27, 2021

(54) MASK FOR THIN FILM DEPOSITION, AND FABRICATION METHOD THEREOF

(71) Applicant: SAMSUNG DISPLAY CO., LTD., Yongin-si (KR)

(72) Inventors: Hyuneok Shin, Yongin-si (KR); Hongsick Park, Yongin-si (KR); Sangwoo Sohn, Yongin-si (KR); Sangwon Shin, Yongin-si (KR); Sanggab Kim, Yongin-si (KR); Shinil Choi, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 252 days.

(21) Appl. No.: 16/122,296

(22) Filed: Sep. 5, 2018

(65) Prior Publication Data

US 2019/0081241 A1 Mar. 14, 2019

(30) Foreign Application Priority Data

Sep. 8, 2017 (KR) .................. 10-2017-0115130

(51) Int. Cl.
*H01L 51/00* (2006.01)
*C23C 14/04* (2006.01)
*C23F 1/02* (2006.01)
*C23F 4/00* (2006.01)
*H01L 51/56* (2006.01)
*B05C 21/00* (2006.01)

(52) U.S. Cl.
CPC ........ *H01L 51/0011* (2013.01); *B05C 21/005* (2013.01); *C23C 14/042* (2013.01); *C23F 1/02* (2013.01); *C23F 4/00* (2013.01); *H01L 51/001* (2013.01); *H01L 51/0097* (2013.01); *H01L 51/56* (2013.01); *H01L 2251/5338* (2013.01)

(58) Field of Classification Search
None
See application file for complete search history.

(56) References Cited

U.S. PATENT DOCUMENTS

| 9,018,103 | B2 | 4/2015 | Guha et al. |
| 9,695,522 | B2 | 7/2017 | Im et al. |
| 2015/0059643 | A1 | 3/2015 | Du et al. |
| 2016/0149133 | A1 | 5/2016 | Kim et al. |
| 2016/0167083 | A1* | 6/2016 | Kim ................ B05B 12/20 118/504 |
| 2019/0019994 | A1* | 1/2019 | Lin ................ H01L 51/56 |

FOREIGN PATENT DOCUMENTS

| KR | 1020150034660 A | 4/2015 |
| KR | 1020150054400 A | 5/2015 |
| KR | 1020160061879 A | 6/2016 |
| KR | 1020160062280 A | 6/2016 |

* cited by examiner

*Primary Examiner* — Jethro M. Pence
(74) *Attorney, Agent, or Firm* — Cantor Colburn LLP

(57) ABSTRACT

A mask for thin film deposition includes a first mask which defines an opening, and a second mask on a surface of the first mask, and which defines a plurality of deposition holes and has a multilayer structure, in which the opening and the plurality of deposition holes communicate with each other and provide a passage for a deposition material, a size of each of the plurality of deposition holes is smaller than a size of the opening, and each of the plurality of deposition holes has a shape corresponding to a deposition pattern to be patterned on a substrate.

11 Claims, 13 Drawing Sheets

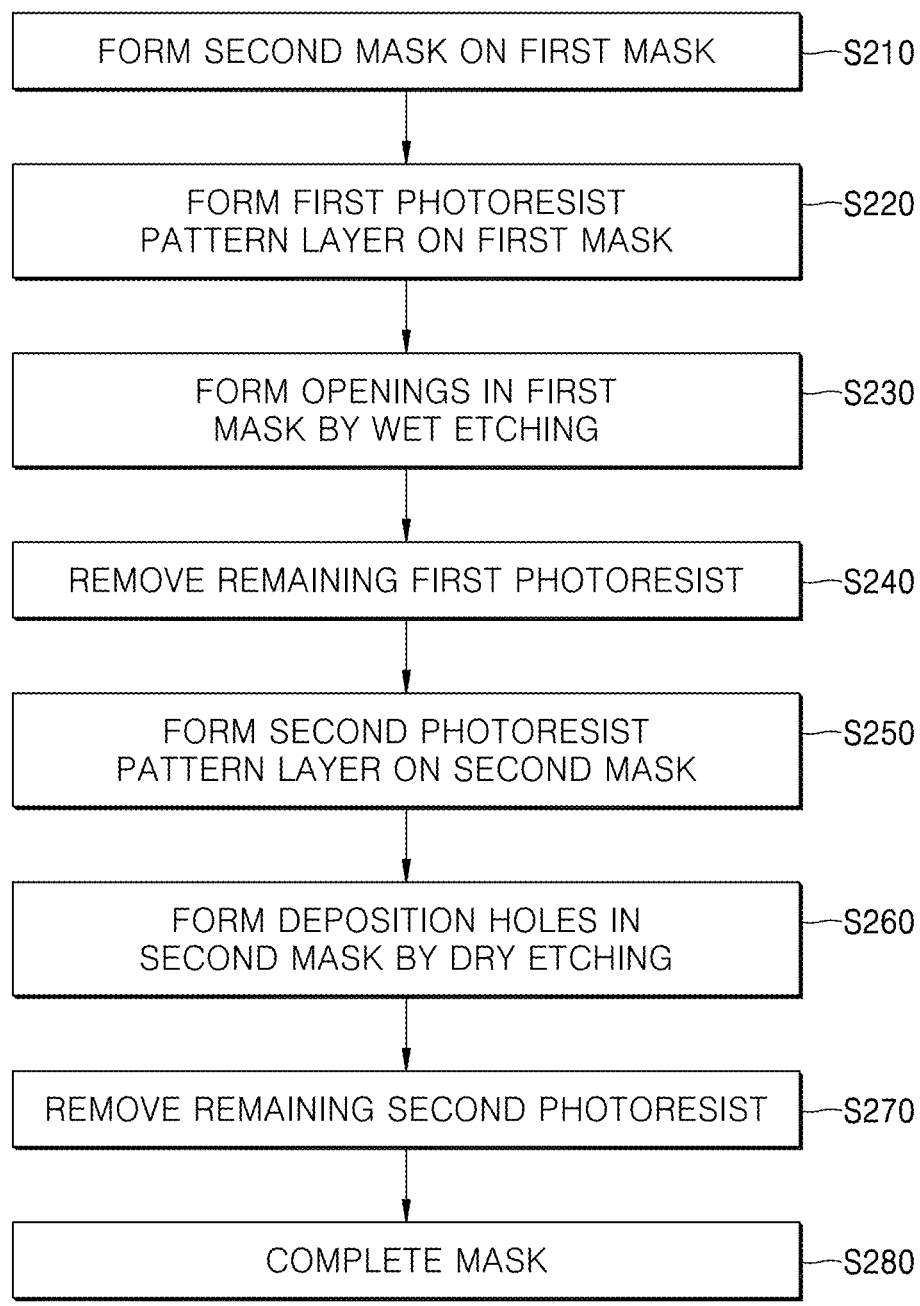

MASK FOR THIN FILM DEPOSITION, AND FABRICATION METHOD THEREOF

This application claims priority to Korean Patent Application No. 10-2017-0115130, filed on Sep. 8, 2017, and all benefits accruing therefrom under 35 U.S.C. § 119, the content of which in its entirety is herein incorporated by reference.

BACKGROUND

1. Field

One or more exemplary embodiments relate to a mask for thin film deposition and a fabrication method thereof.

2. Description of the Related Art

Typically, a display device may be used for a mobile device such as a smart phone, a laptop computer, a digital camera, a camcorder, a portable information terminal, a notebook computer, and a tablet personal computer, or an electronic apparatus such as a watch, a desktop computer, a television, an outdoor display, a display device for display, an automotive instrument panel, and a head up display ("HUD"), for example, but is not limited thereto. Recently, slimmer display devices have been introduced.

A flexible display device can be applied to a device having various shapes and easy to carry. Among the flexible display device, a display device based on organic light-emitting display technology is the most highlighted flexible display device.

A deposition pattern such as an organic light-emitting layer may be formed on a substrate for a display device. The deposition pattern may be formed by a deposition method. The deposition method is to deposit a deposition material on a substrate using a deposition mask in which a deposition hole corresponding to a deposition pattern is patterned. However, when the deposition hole formed in the deposition mask is not properly patterned, a precise deposition pattern may not be formed on the substrate.

SUMMARY

According to one or more exemplary embodiments, a mask for thin film deposition includes a first mask which defines an opening, and a second mask on a surface of the first mask, and which defines a plurality of deposition holes and has a multilayer structure, in which the opening and the plurality of deposition holes communicate with each other and provide a passage for a deposition material, a size of each of the plurality of deposition holes is smaller than a size of the opening, and each of the plurality of deposition holes has a shape corresponding to a deposition pattern to be patterned on a substrate.

In an exemplary embodiment, the first mask may include an iron-nickel alloy.

In an exemplary embodiment, the second mask may include a metal layer arranged on a surface of the first mask and a metallic compound layer on the metal layer.

In an exemplary embodiment, a thickness of the first mask may be about 5 millimeters (mm) to about 30 mm.

In an exemplary embodiment, a thickness of the second mask may be about 100 nm to about 2,000 nm.

In an exemplary embodiment, the second mask may include a first surface facing the substrate and a second surface disposed in a direction opposite to the first surface and facing the first mask, and the plurality of deposition holes may be arranged at positions corresponding to deposition patterns on the substrate in a direction perpendicular to the first surface.

In an exemplary embodiment, the opening may include a plurality of openings, each of the plurality of openings is surrounded by portions of the first mask, each of the plurality of openings is arranged at a position corresponding to each of the plurality of deposition holes in the direction perpendicular to the first surface, and a size of each of the plurality of openings may be greater than a size of each of the plurality of deposition holes.

In an exemplary embodiment, the opening may be an area obtained by etching the first mask to a thickness of the first mask or more.

In an exemplary embodiment, a size of the first mask may correspond to a base mask, the opening is arranged in a first area corresponding to a unit display device, and the second mask may be arranged in a second area corresponding to the unit display device.

In an exemplary embodiment, the opening may include a single opening surrounded by portions of the first mask, the single opening may communicate with all of the plurality of deposition holes in the second mask arranged in the second area, and a size of the single opening may be greater than a size of each of the plurality of deposition holes.

In an exemplary embodiment, a size of the first mask may correspond to a base mask, the opening comprises a plurality of openings and the second mask comprises a plurality of second masks, the plurality of openings is arranged in a first area corresponding to a unit display device, and each of the plurality of the second masks may be arranged in each of the plurality of openings in a second area corresponding to the unit display device.

In an exemplary embodiment, the plurality of openings may be spaced apart from each other in a first horizontal direction of the first mask and may extend in a second horizontal direction perpendicular to the first horizontal direction, each of the plurality of openings may be surrounded by portions of the first mask, the first and second horizontal directions defines a plane of the surface of the first mask, and each of the plurality of openings may communicate with a corresponding one of the deposition holes in the first horizontal direction, and may communicates with all of the deposition holes, neighboring in the second horizontal direction, in each of the second mask.

According to one or more exemplary embodiments, a method of fabricating a mask for thin film deposition includes forming, on a surface of a first mask, a second mask in a multilayer, forming a photoresist pattern layer on the second mask, forming a plurality of deposition holes in the second mask by dry etching, forming an opening having a size greater than each of the plurality of deposition holes in the first mask by wet etching, wherein the opening and the plurality of deposition holes communicate with each other, and removing the photoresist pattern layer that remains.

In an exemplary embodiment, the second mask may include a metal layer and a metallic compound layer, the metal layer may be formed on the first mask, and a metal compound layer may be formed on the metal layer.

In an exemplary embodiment, the first mask may have a thickness of about 5 mm to about 30 mm.

In an exemplary embodiment, the second mask may have a thickness of about 100 nm to about 2,000 nm.

In an exemplary embodiment, the plurality of deposition holes may be arranged at positions corresponding to deposition patterns on the substrate in a direction perpendicular to the surface of the first mask.

In an exemplary embodiment, the opening may include a plurality of openings, each of the plurality of openings is surrounded by portions of the first mask, each of the plurality of openings may be formed at a position corresponding to each of the plurality of deposition holes in the direction perpendicular to the surface of the first mask, and a size of each of the plurality of openings may be greater than a size of each of the plurality of deposition holes.

According to one or more exemplary embodiments, a method of fabricating a mask for thin film deposition includes forming, on a surface of the first mask, a second mask in a multilayer, forming a first photoresist pattern layer on the first mask, forming an opening in the first mask by wet etching, removing the first photoresist pattern layer that remains, forming a second photoresist pattern layer on the second mask, forming a plurality of deposition holes in the second mask by dry etching, wherein each of the plurality of deposition holes has a size smaller than the opening, and each of the plurality of deposition holes communicates with the opening, and removing the second photoresist pattern layer that remains.

In an exemplary embodiment, the second mask may include a metal layer and a metallic compound layer, a metal layer may be formed on the first mask, and a metal compound layer may be formed on the metal layer.

BRIEF DESCRIPTION OF THE DRAWINGS

These and/or other aspects will become apparent and more readily appreciated from the following description of the exemplary embodiments, taken in conjunction with the accompanying drawings in which:

FIG. 10 is a flowchart for explaining another exemplary embodiment of a method of fabricating a mask for deposition, according to the invention;

DETAILED DESCRIPTION

Figure 1:
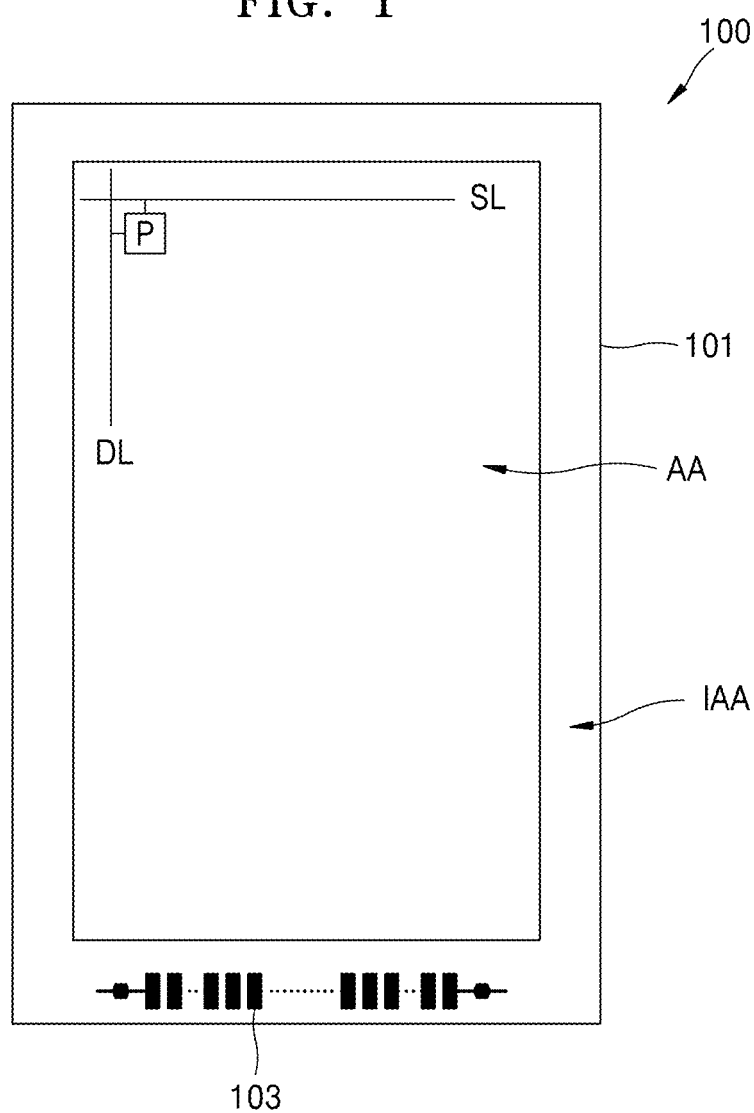
FIG. 1 is a plan view of an exemplary embodiment of a display device according to the invention.

As the inventive concept allows for various changes and numerous exemplary embodiments, exemplary embodiments will be illustrated in the drawings and described in detail in the written description. However, this is not intended to limit the inventive concept to particular modes of practice, and it is to be appreciated that all changes, equivalents, and substitutes that do not depart from the spirit and technical scope of the inventive concept are encompassed in the inventive concept.

It will be understood that when a layer, region, or component is referred to as being "on" another layer, region, or component, it can be directly or indirectly on the other layer, region, or component. That is, for example, intervening layers, regions, or components may be present. Sizes of components in the drawings may be exaggerated for convenience of explanation. In other words, since sizes and thicknesses of components in the drawings are arbitrarily illustrated for convenience of explanation, the following exemplary embodiments are not limited thereto. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another. "About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an."

Figure 2:
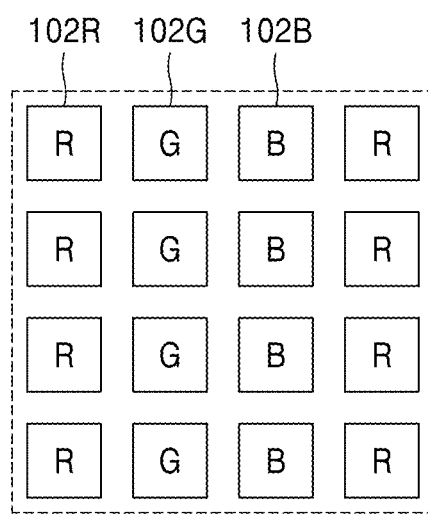
FIG. 2 is an enlarged plan view of an exemplary embodiment of an organic light-emitting layer arranged in an active area of FIG. 1.

FIG. 1 is a plan view of an exemplary embodiment of a display device 100 according to the invention. FIG. 2 is an enlarged plan view of an exemplary embodiment of an organic light-emitting layer arranged in an active area AA of FIG. 1.

Referring to FIGS. 1 and 2, a substrate 101 may include various materials. The substrate 101 may be glass containing silicon oxide $SiO_2$ as a main content. In another exemplary embodiment, the substrate 101 may be plastic. In still another exemplary embodiment, the substrate 101 may be a film having flexibility.

An active area AA displaying an image and an inactive area IAA extending out of the active area AA may be arranged on the substrate 101.

A plurality of pixels P may be arranged in the active area AA. Each of the pixels P may be disposed in an intersection area between a data line DL and a scan line SL. A red emission layer 102R, a green emission layer 102G, and a blue emission layer 102B may be arranged at each of the pixels P. The organic light-emitting layers may include a combination of various colors.

A pad portion 103 for transmitting an electrical signal from a power supply unit (not shown) or a signal generation unit (not shown) to the active area AA may be arranged in the inactive area IAA.

Each of a plurality of red emission layers 102R, a plurality of green emission layers 102G, and a plurality of blue emission layers 102B may be patterned in the active AA using a mask for deposition.

Figure 3:
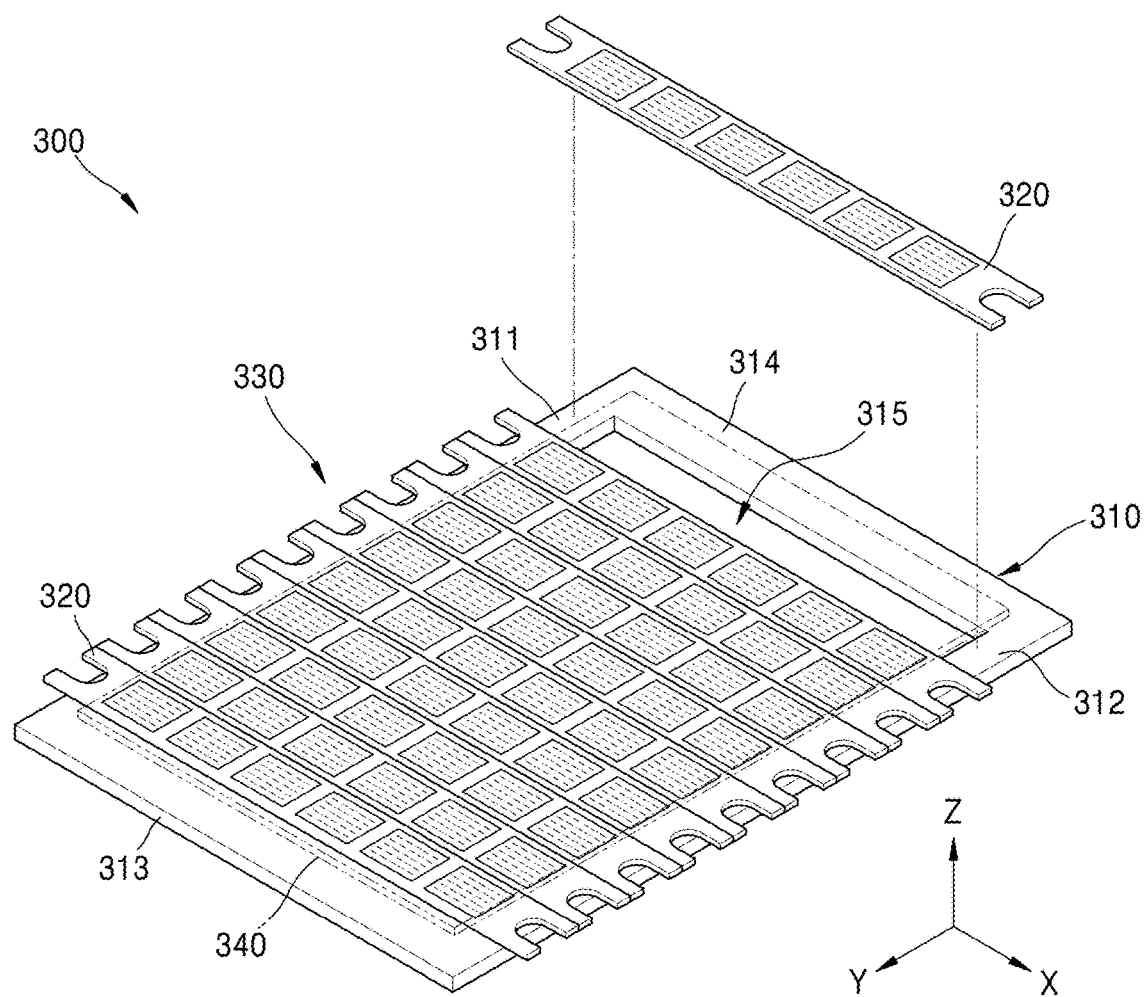
FIG. 3 is a perspective view of an exemplary embodiment of a mask assembly for thin film deposition, according to the invention.

FIG. 3 is a perspective view of an exemplary embodiment of a mask assembly 300 for thin film deposition, according to the invention.

Referring to FIG. 3, the mask assembly 300 may include a mask frame 310 and a mask for deposition 330 having a plurality of stick masks 320.

The mask frame 310 has a plurality of first to fourth frames 311 to 314 which defines an opening 315. The first to fourth frames 311 to 314 may be connected to one another.

The mask frame 310 may include the first frame 311 and the second frame 312 facing each other in an X direction and extending in a Y direction, and the third frame 313 and the fourth frame 314 facing each other in the Y direction and extending in the X direction. The first frame 311, the second frame 312, the third frame 313, and the fourth frame 314 may be connected to one another, forming a rectangular frame. The mask frame 310 may be fabricated of a less deformable material when the mask for deposition 330 is welded, that is, metal exhibiting high rigidity.

The mask for deposition 330 may be mounted on the mask frame 310. A substrate 340 where a deposition pattern is to be formed may be arranged on the mask for deposition 330. The mask for deposition 330 may include the plurality of stick masks 320 that are separated from one another in the Y direction rather than a monolithic mask to effectively prevent sagging due to its weight.

The stick masks 320 may be separated in a direction (Y direction) intersecting a longitudinal direction (X direction). The stick masks 320 may be continuously arranged between the third frame 313 and the fourth frame 314, and both ends of each of the stick masks 320 may be fixed by welding to the first frame 311 and the second frame 312. The stick masks 320 may cover the opening 315.

Figure 4:
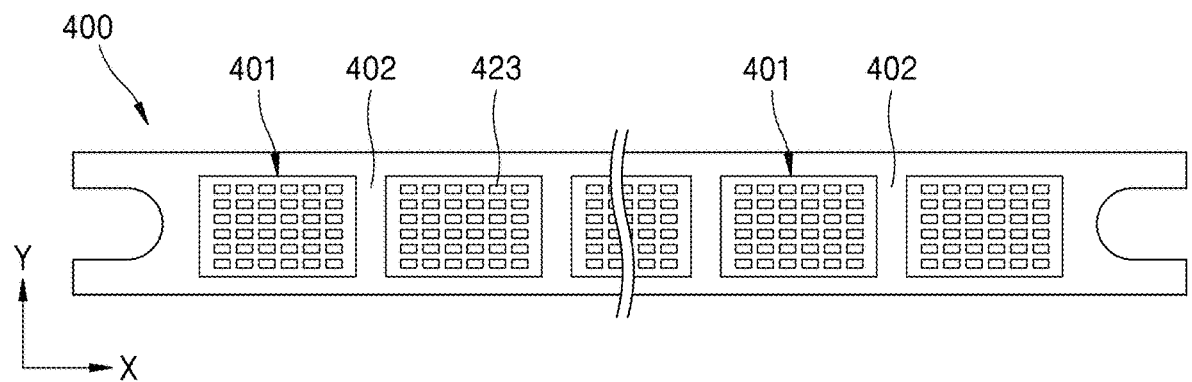
FIG. 4 is a plan view of an exemplary embodiment of a mask for deposition according to the invention.
Figure 5:
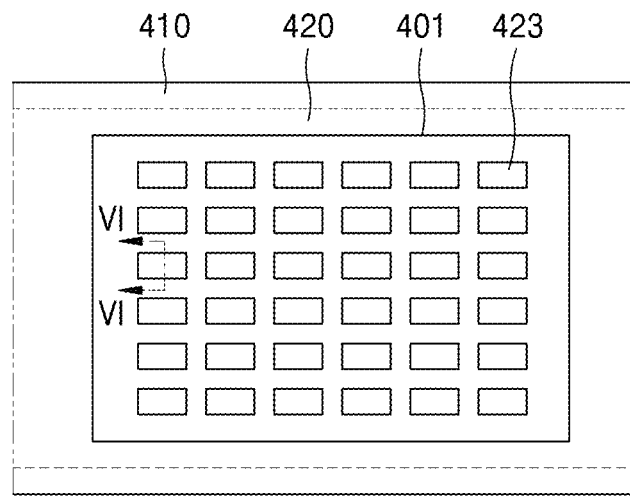
FIG. 5 is a partially enlarged plan view of the mask for deposition of FIG. 4.
Figure 6:
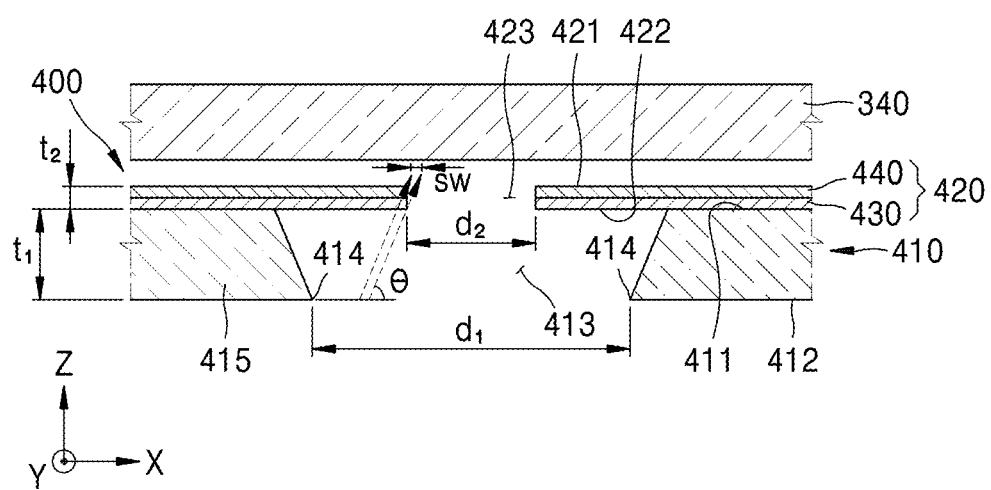
FIG. 6 is a cross-sectional view taken along line VI-VI' of FIG. 5.
Figure 7:
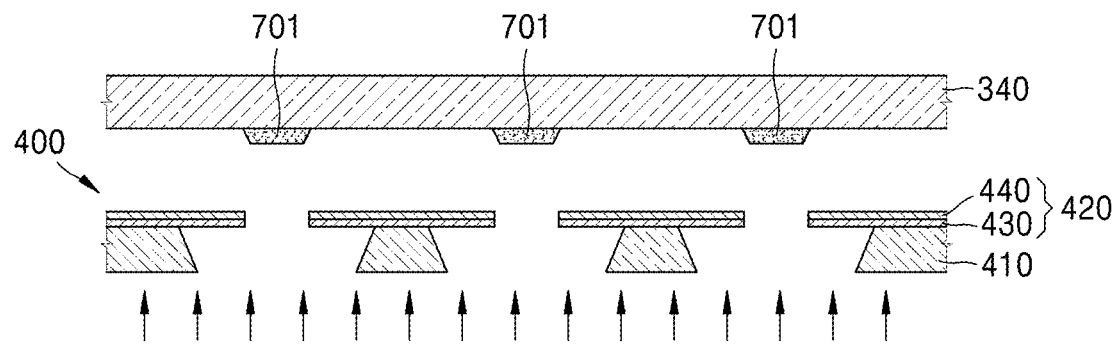
FIG. 7 is a cross-sectional view illustrating an exemplary embodiment of forming of a deposition pattern on a substrate by using the mask for deposition of FIG. 4.

FIG. 4 is a plan view of an exemplary embodiment of a mask for deposition 400 according to the invention. FIG. 5 is a partially enlarged plan view of the mask for deposition 400 of FIG. 4. FIG. 6 is a cross-sectional view taken along line VI-VI' of FIG. 5. FIG. 7 is a cross-sectional view illustrating an exemplary embodiment of forming of a deposition pattern 701 on the substrate 340 by using the mask for deposition 400 of FIG. 4.

In FIGS. 4 to 6, an exemplary embodiment that the mask for deposition 400 include one stick mask 320 of FIG. 3 is illustrated. However, in another exemplary embodiment, the mask for deposition 400 may include the plurality of stick masks 320. In an exemplary embodiment, as long as the width of the mask for deposition 400 is less than the length of the mask for deposition 400 extending in the longitudinal direction (X direction), the ratio of the width to the length of the mask for deposition 400 is not limited to any particular ratio.

A plurality of deposition pattern portions 401 may be arranged on the mask for deposition 400. The deposition pattern portions 401 may be arranged spaced apart in a length direction (X direction) of the mask for deposition 400. In an exemplary embodiment, each of the deposition pattern portions 401 may correspond to a unit display device, for example, one compact mobile device. In another exemplary embodiment, a plurality of masks for deposition 400 may correspond to a large display device. A plurality of deposition holes 423 may be arranged in each of the deposition pattern portions 401.

A rib 402 may be arranged between the deposition pattern portions 401 that neighbor each other. The rib 402 may connect the neighboring deposition pattern portions 401 arranged in the length direction (X direction) of the mask for deposition 400 to one another. A dummy deposition pattern portion (not shown) may be arranged on the rib 402. The dummy deposition pattern portion may define an opening or an etched part.

The mask for deposition 400 may have a stacked structure of a plurality of masks.

In detail, the mask for deposition 400 may include a first mask 410 and a second mask 420 arranged on a surface of the first mask 410. The first mask 410 and the second mask 420 may overlap with each other in a normal direction (Z direction) of a plane defined by a main surface of the mask for deposition 400. The second mask 420 may extend across the entire area of the first mask 410. In an exemplary embodiment, the size of the first mask 410 and the size of the second mask 420 may be the same.

The first mask 410 may include a first surface 411 facing the second mask 420 and a second surface 412 opposite to the first surface 411. The first mask 410 may define an opening 413. In an exemplary embodiment, a plurality of openings 413 may be arranged corresponding to the deposition holes 423.

The first mask 410 may retain mechanical strength during tension, and may be formed of or include a material having a very low thermal expansion coefficient. In an exemplary embodiment, the first mask 410 may include an iron-nickel alloy. In another exemplary embodiment, the first mask 410 may be stainless steel or a nickel-cobalt alloy. A first thickness $t_1$ of the first mask 410 may be about 5 millimeters (mm) to about 30 mm.

The second mask 420 may include a first surface 421 facing the substrate 340, and a second surface 422 arranged in a direction opposite to the first surface 421 and facing the first surface 411 of the first mask 410. In an exemplary embodiment, the substrate 340 and the first surface 421 of the second mask 420 may be spaced apart by a predetermined distance. The first surface 411 of the first mask 410 and the second surface 422 of the second mask 420 may contact each other.

The second mask 420 may include a plurality of thin film layers. The second mask 420 may be formed of or include a material having relatively great chemical corrosion resistance and relatively great mechanical abrasion resistance. The second mask 420 may include a metal layer 430 arranged on the first surface 411 of the first mask 410 and a metallic compound layer 440 arranged on the metal layer 430. In an exemplary embodiment, the metal layer 430 may include a metallic material such as titanium (Ti), molybdenum (Mo), tungsten (W), chrome (Cr), etc. In an exemplary embodiment, the metallic compound layer 440 may include a metal nitride such as titanium nitride (TiN), a metal carbide such as tungsten carbide (WC), or a metal oxide such as aluminum oxide ($Al_2O_3$).

In an exemplary embodiment, the second mask 420 may have a stacked structure of titanium (Ti) and titanium nitride (TiN). The metallic compound layer 440 such as titanium nitride (TiN) may be arranged as a top layer. The stacked layer of the second mask 420 is not limited to the above exemplary embodiment. In an exemplary embodiment, titanium nitride (TiN) has the Mohs hardness of 9, which may be a material having relatively great abrasion resistance.

A second thickness $t_2$ of the second mask 420 may be about 100 nm to about 2,000 nm. The second thickness $t_2$ of the second mask 420 may control a shadow effect which occurs when the deposition pattern 701 is formed on the substrate 340. As the thickness of the second mask 420 decreases, the shadow effect may be reduced. The shadow effect will be described later in detail. The second thickness $t_2$ of the second mask 420 may be thinner than the first thickness $t_1$ of the first mask 410. In an exemplary embodiment, the second thickness $t_2$ of the second mask 420 may be about ⅕ to about 1/20 of the first thickness $t_1$ of the first mask 410.

The deposition holes 423 may be arranged in the second mask 420. Each of the deposition holes 423 may be arranged at a position corresponding to the deposition pattern 701 on the substrate 340 in the direction (Z direction) perpendicular to the plane defined by the main surface of the mask for deposition 400 (e.g., the first surface 421) having a stacked structure. The deposition pattern 701 may be patterned by a deposition material that passes through the deposition holes 423. Each of the deposition holes 423 may have a shape corresponding to the deposition pattern 701. In an exemplary embodiment, the deposition holes 423 may have a strip pattern or a dot pattern, but the shape of the deposition holes 423 is not limited thereto.

The openings 413 and the deposition holes 423 communicate with each other to provide a passage of a deposition material. In an exemplary embodiment, the openings 413 may be arranged at the deposition holes 423, respectively. Each of the openings 413 may be surrounded by portions 415 of the first mask 410. When each of the openings 413 has a strip shape, the opening 413 may be a space surrounded by four side walls of the first mask 410. In an exemplary embodiment, the openings 413 provide passages through which a deposition material passes, and may have any shape.

The size of each of the openings 413 is greater than that of each of the deposition holes 423. The size of each of the deposition holes 423 may correspond to the deposition pattern 701. The openings 413 do not substantially contribute to the formation of the deposition pattern 701. Accordingly, the size of each of the openings 413 is not limited to a specific one as long as the opening 413 can sufficiently secure a space for passing a deposition material. Since the size of each of the opening 413 is greater than that of each of the deposition holes 423, part of the second surface 422 of the second mask 420 around the deposition hole 423 may be exposed to the outside.

Typically, when a deposition material passes through the deposition holes 423 to be deposited on the substrate 340, the shadow effect is generated due to the mask for deposition 400. In particular, a deposition material passes through the deposition holes 423 with a deposition angle θ with respect to the plane defined by the main surface of the mask for deposition 400. If the deposition angle θ is less than 90°, the thickness of the deposition pattern 701 may be irregular at an edge of the deposition pattern 701 formed on the substrate 340. Consequently, a desired deposition pattern may not be formed. This is the shadow effect.

In order to precisely form the deposition pattern 701, it is advantageous to decrease the thickness of the mask for deposition 400 having the deposition holes 423 for passing a deposition material. In this case, while a portion of the deposition material pass through the deposition holes 423 defined in the second mask 420, the other portion of the deposition material may collide against the second surface 422 of the second mask 420 around the deposition holes 423. As the second thickness $t_2$ of the second mask 420 decreases, a shadow width SW, which is a width of a region where the thickness of the deposition pattern 701 is irregular, may decrease. As the second thickness $t_2$ of the second mask 420 increases, the shadow width SW also increases. In an exemplary embodiment, the deposition angle θ of the deposition material may be 45° or more.

As described above, each of the openings 413 may be formed to be sufficiently larger than the size of each of the deposition holes 423 so as not to affect the progression of the deposition material. Each of the openings 413 may be formed by etching the first mask 410 to be greater than the thickness $t_1$ of the first mask 410. In an exemplary embodiment, each of the openings 413 may be an area obtained by removing a portion of the first mask 410 such that the deposition angle of the deposition material is 45° or more. Two edges 414 of the first mask 410 facing each other with the opening 413 defined therebetween may have a first distance $d_1$ from each other. The first distance $d_1$ of the opening 413 may be greater than a second distance $d_2$ of the deposition hole 423.

In order to reduce the shadow effect, it is advantageous to decrease the second thickness $t_2$ of the second mask 420 that directly contributes to the formation to the deposition pattern 701. However, when the second thickness $t_2$ of the second mask 420 is too thin, it is disadvantageous for the mechanical strength. Accordingly, the first mask 410 that is thicker than the second mask 420 may be arranged under the second mask 420. The first mask 410 may effectively prevent deformation of the second mask 420.

Figure 8:
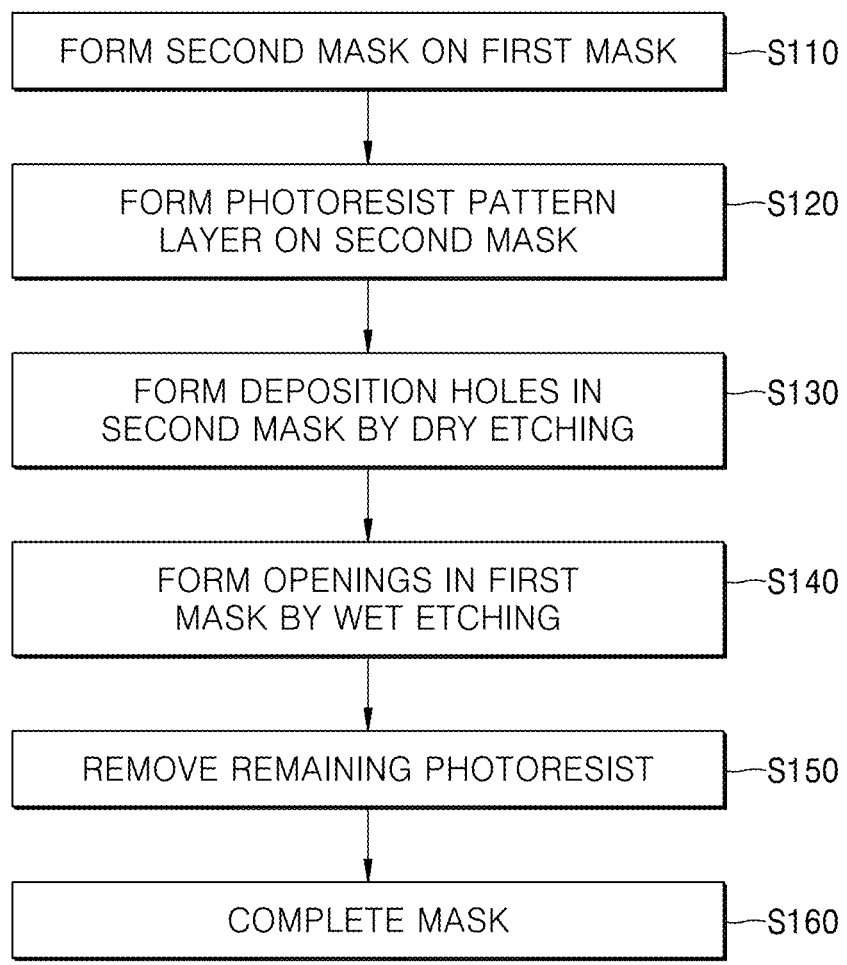
FIG. 8 is a flowchart for explaining an exemplary embodiment of a method of fabricating the mask for deposition of FIG. 4.

FIG. 8 is a flowchart for explaining an exemplary embodiment of a method of fabricating the mask for deposition 400 of FIG. 4. FIGS. 9A to 9E are cross-sectional views sequentially illustrating an exemplary embodiment of a step-by-step process of fabricating the mask for deposition 400 of FIG. 4.

Figure 9A:
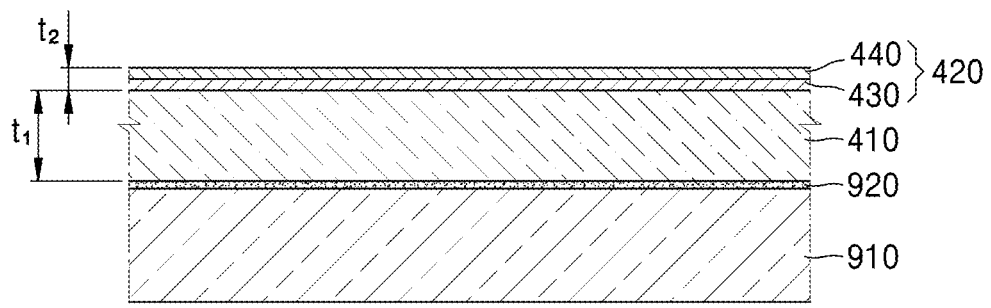
FIGS. 9A to 9E are cross-sectional views sequentially illustrating an exemplary embodiment of a step-by-step process of fabricating the mask for deposition of FIG. 4.

Referring to FIGS. 8 and 9A, the second mask 420 having a plurality of thin film layers is formed on a surface of the first mask 410 (S110).

The first mask 410 may include an iron-nickel alloy. The first thickness $t_1$ of the first mask 410 may be about 5 mm to about 30 mm. The metal layer 430 is deposited on the first surface 411 of the first mask 410, and the metallic compound layer 440 is deposited on the metal layer 430. The second thickness $t_2$ of the second mask 420 may be about 100 nm to about 2,000 nm. The second thickness $t_2$ of the second mask 420 is thinner than the first thickness $t_1$ of the first mask 410.

For convenience of a manufacturing process, the mask for deposition 400 may be fabricated on a base substrate 910. An adhesive material 920 may be disposed on a surface of the base substrate 910 facing the mask for deposition 400. In an exemplary embodiment, the base substrate 910 may be glass. In another exemplary embodiment, the base substrate 910 may be a sheet having a plurality of holes.

Figure 9B:
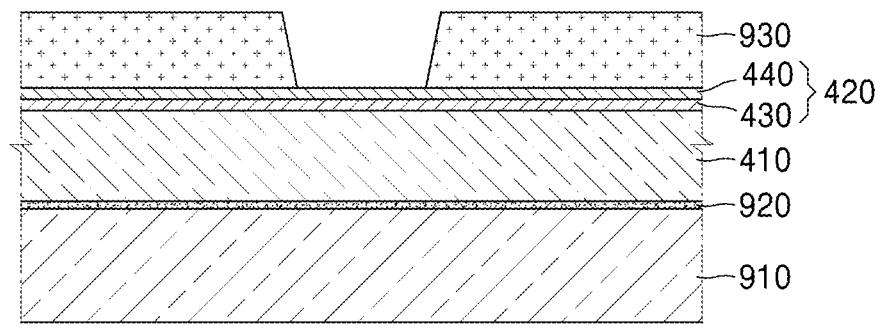

Referring to FIGS. 8 and 9B, a photoresist pattern layer 930 is formed on the second mask 420 (S120). The photoresist pattern layer 930 is patterned. A patterned area in the photoresist pattern layer 930 may correspond to an area where the deposition holes 423 is to be formed later.

Figure 9C:
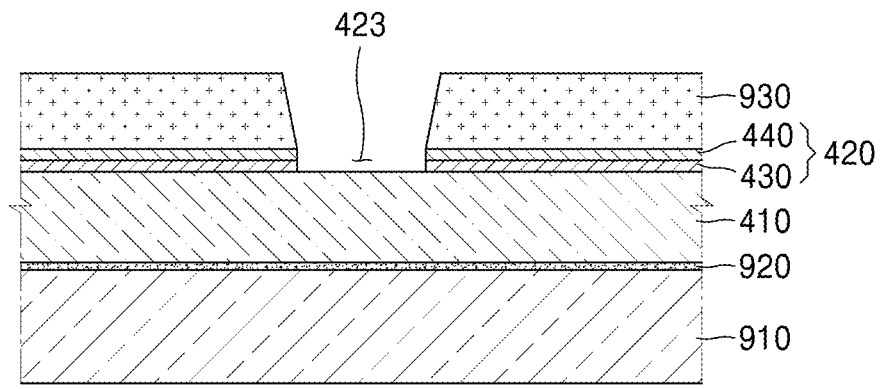

Referring to FIGS. 8 and 9C, a plurality of the deposition holes 423 are formed in the second mask 420 (S130). The deposition holes 423 are formed by dry etching. The deposition holes 423 may be formed by a plasma etching process in an atmosphere including a chlorine gas $Cl_2$. The deposition holes 423 are formed at positions corresponding to the deposition pattern 701 formed on the substrate 340 in the normal direction to the main surface of the mask for deposition 400 of FIG. 7 of a stacked structure. The deposition holes 423 have a shape corresponding to the deposition pattern 701.

Figure 9D:
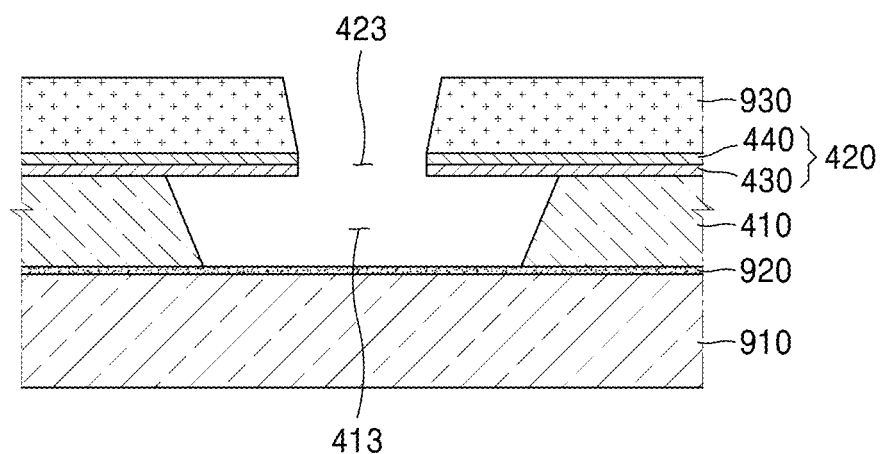

Referring to FIGS. 8 and 9D, the openings 413 are formed in the first mask 410 (S140). The openings 413 are formed by wet etching. The opening 413 may be formed by a wet etching process using an iron chloride based etching solution. The openings 413 and the deposition holes 423 communicate with each other. The size of each of the openings 413 is larger than that of each of the deposition holes 423.

Figure 9E:
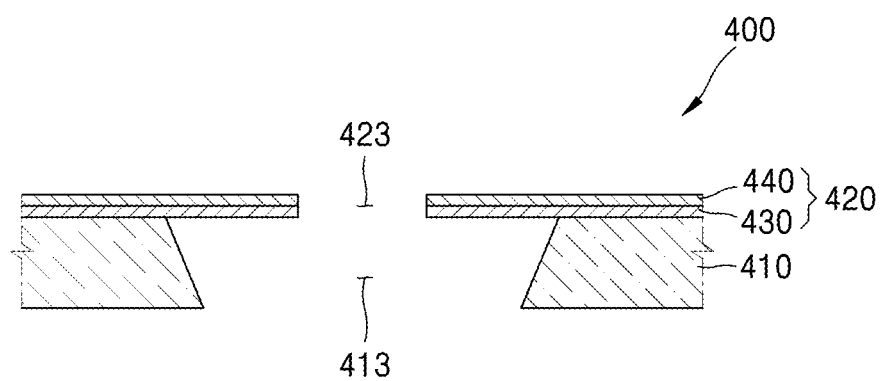

Referring to FIGS. 8 and 9E, the mask for deposition 400 is completed by removing remaining photoresist (S150 and S160). The mask for deposition 400 is separated from the base substrate 910.

Since the mask for deposition 400 having the above-described structure can reduce clogging of the space through which the deposition material passes, the lifespan of the mask for deposition 400 is relatively long.

FIG. 10 is a flowchart for explaining another exemplary embodiment of a method of fabricating the mask for deposition of 400, according to the invention. FIGS. 11A to 11G are cross-sectional views sequentially illustrating an exemplary embodiment of a step-by-step process of fabricating the mask for deposition 400 of FIG. 10.

Figure 11A:
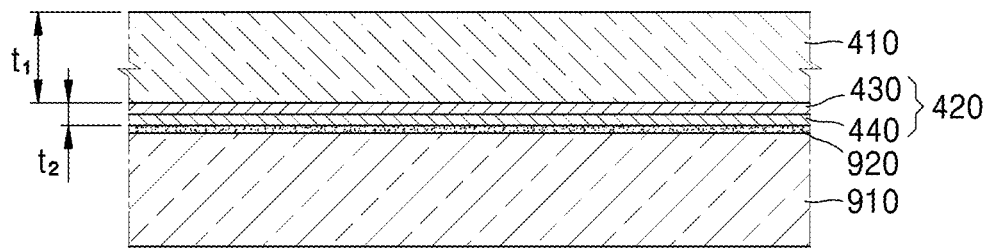
FIGS. 11A to 11G are cross-sectional views sequentially illustrating an exemplary embodiment of a step-by-step process of fabricating the mask for deposition of FIG. 10.

Referring to FIGS. 10 and 11A, the second mask 420 having a plurality of thin film layers is formed on a surface of the first mask 410 (S210).

The first mask 410 may include an iron-nickel alloy. The metal layer 430 is deposited on the first surface 411 of the first mask 410, and the metallic compound layer 440 is deposited on the metal layer 430. The second thickness $t_2$ of the second mask 420 is thinner than the first thickness $t_1$ of the first mask 410. Compared to the mask for deposition 400 of FIG. 9A, the mask for deposition 400 in FIG. 11A is illustrated upside down.

The mask for deposition 400 may be fabricated on the base substrate 910. Unlike the previous exemplary embodiment of FIG. 9A, the second mask 420 is first arranged on the base substrate 910, and the first mask 410 is arranged on the second mask 420.

Figure 11B:
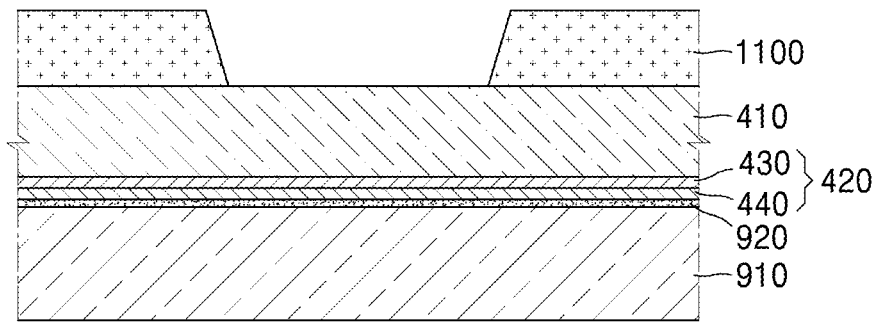

Referring to FIGS. 10 and 11B, a first photoresist pattern layer 1100 is formed on the first mask 410 (S220). A patterned area in the first photoresist pattern layer 1100 may substantially correspond to an area where the openings 413 is to be formed later.

Figure 11C:
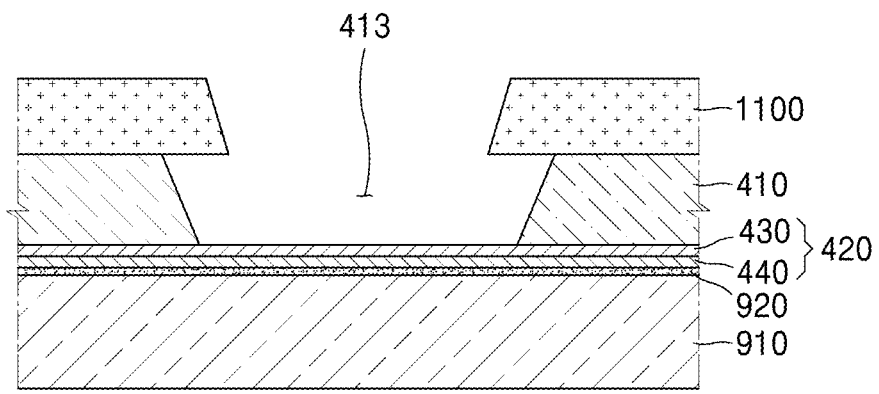

Referring to FIGS. 10 and 11C, the opening 413 is formed in the first mask 410 (S230). The opening 413 is formed by wet etching. In an exemplary embodiment, the opening 413 may be formed by a wet etch process using an iron chloride based etching solution.

Next, the first photoresist pattern layer 1100 that remains on the first mask 410 is removed (S240).

Figure 11D:
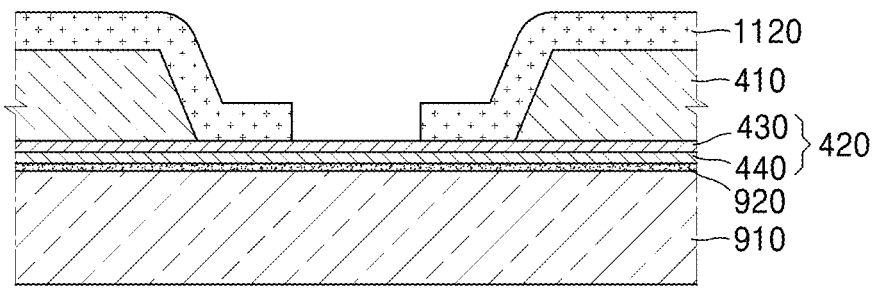

Referring to FIGS. 10 and 11D, a second photoresist pattern layer 1120 is formed on the second mask 420 (S250) In particular, the second photoresist pattern layer 1120 is formed on the first mask 410 that is patterned and the metal layer 430 corresponding to the opening 413. The second photoresist pattern layer 1120 is patterned. A patterned area in the second photoresist pattern layer 1120 may correspond to the area where the deposition holes 423 is to be formed later.

Figure 11E:
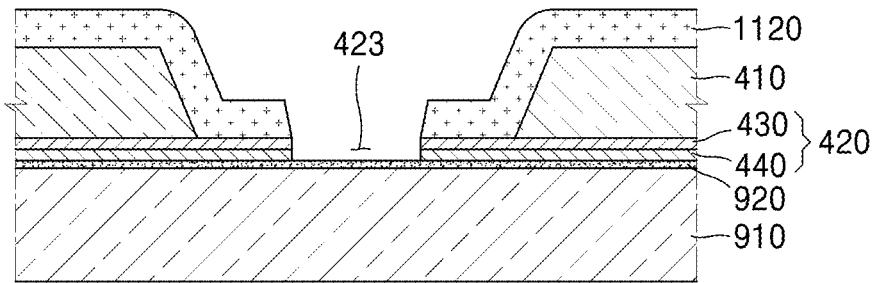

Referring to FIGS. 10 and 11E, the deposition holes 423 are formed in the second mask 420 (S260). The deposition holes 423 are formed by dry etching. In an exemplary embodiment, the deposition holes 423 may be formed by a plasma etching process in an atmosphere including a chlorine gas $Cl_2$.

The deposition holes 423 are formed at positions corresponding to the deposition pattern 701 to be formed on the substrate 340 in the direction perpendicular to the main surface of the mask 400 of FIG. 7 of a stacked structure. The deposition holes 423 have a shape corresponding to the deposition pattern 701. The openings 413 and the deposition holes 423 communicate with each other. The size of each of the deposition holes 423 is smaller than that of each of the openings 413.

Figure 11F:
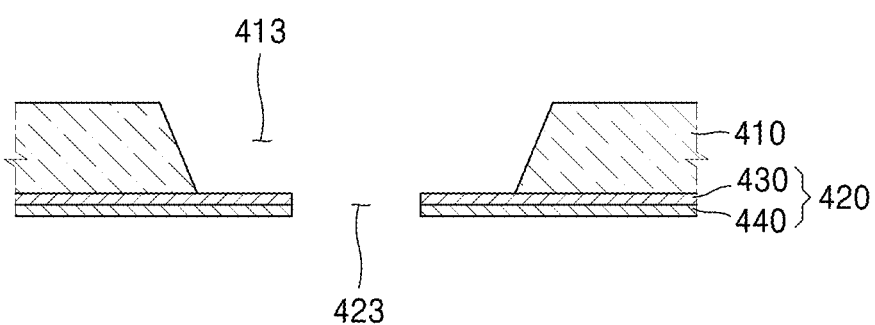

Referring to FIGS. 10 and 11F, the mask for deposition 400 is completed by removing the second photoresist that remains (S270 and S280). The mask for deposition 400 is separated from the base substrate 910.

Figure 11G:
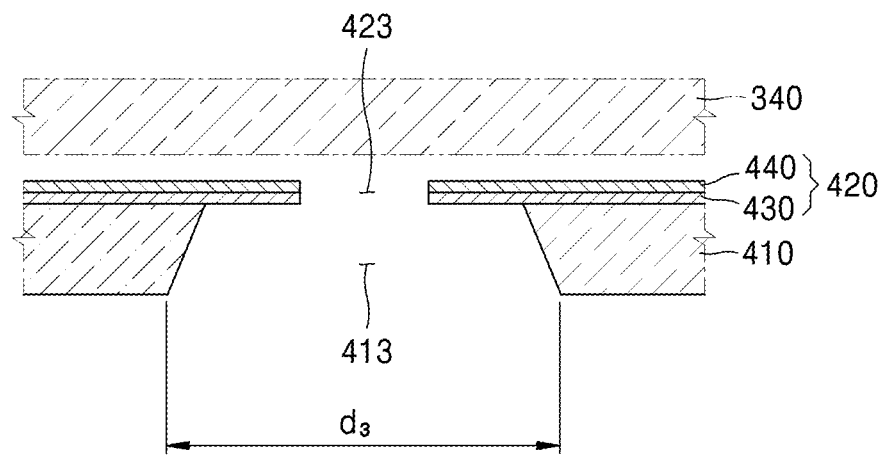

Referring to FIG. 11G, the second mask 420 is flipped to face the substrate 340 and a deposition process is performed.

In the mask for deposition 400 having the above-described structure, a third distance $d_3$ between both edges of the first mask 410 with the opening 413 defined therebetween may be greater than that (e.g., the second distance $d_2$) in the previous exemplary embodiments in FIGS. 9E and 6. Accordingly, the mask for deposition 400 in FIG. 11G is more advantageous in terms of the shadow effect than the mask for deposition 400 in FIG. 9E.

Figure 12:
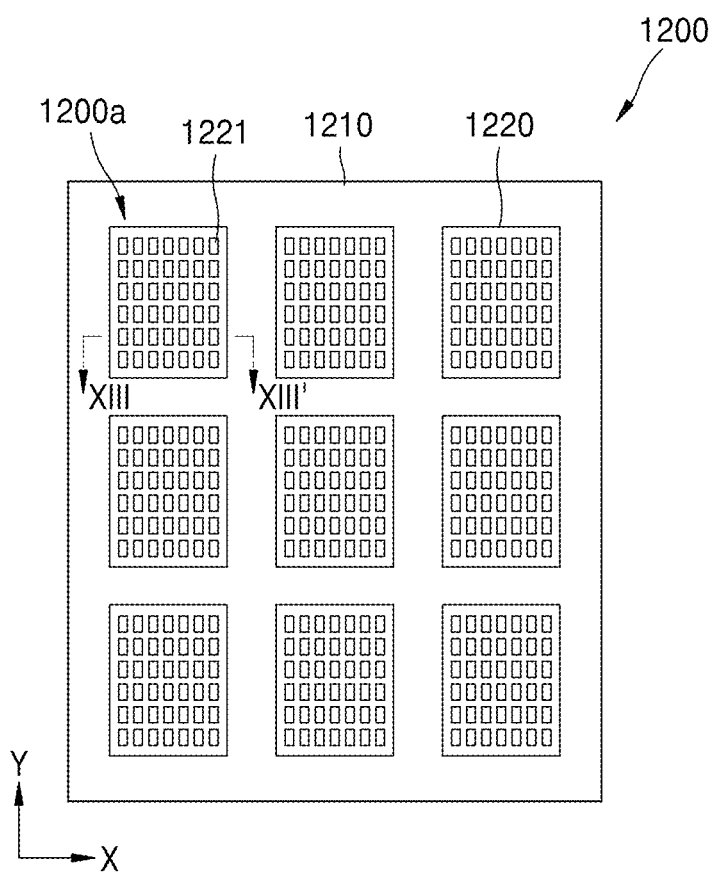
FIG. 12 is a plan view of another exemplary embodiment of a mask for deposition according to the invention.
Figure 13:
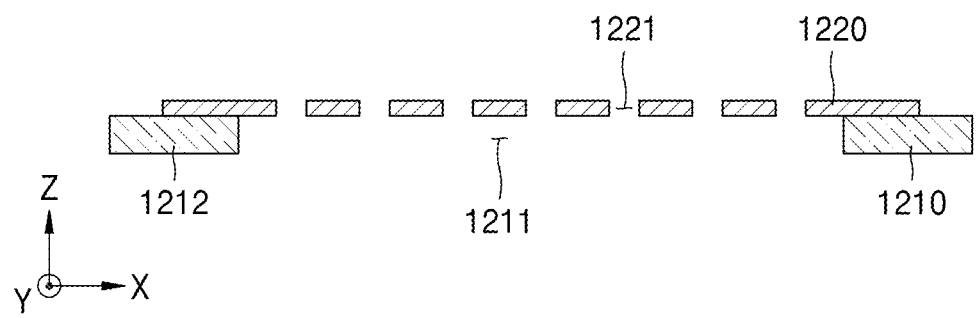
FIG. 13 is a cross-sectional view taken along line XIII-XIII' of FIG. 12.

FIG. 12 is a plan view illustrating another exemplary embodiment of a mask for deposition according to the invention. FIG. 13 is a cross-sectional view taken along line XIII-XIII' of FIG. 12.

Referring to FIGS. 12 and 13, the mask for deposition 1200 may be a base mask. The mask for deposition 1200 may be used to simultaneously fabricate a plurality of display devices. The mask for deposition 1200 may include a first mask 1210 and a plurality of second mask 1220 arranged on a surface of the first mask 1210.

The size of the first mask 1210 that is a lower mask may correspond to the size of the base mask. A single opening 1211 may be arranged for each area corresponding to a unit display device. In an exemplary embodiment, for example, a plurality of single openings 1211 may be arranged spaced apart from each other by a predetermined distance in the X direction and the Y direction. Each of the second masks 1220 that is an upper mask may be arranged in an area corresponding to each unit display device.

The first mask 1210 and the second masks 1220 may overlap in the direction (Z direction) perpendicular to the main surface of the mask for deposition 1200. The first mask 1210 may include an iron-nickel alloy. The second masks 1220 may include a metal layer and a metallic compound layer arranged on the metal layer. The top layer of the mask for deposition 1200 may be the metallic compound layer.

Referring to a unit mask for deposition 1200a corresponding to one unit display device, one single opening 1211 may be arranged in the first mask 1210. The single opening 1211 may be surrounded by portions 1212 of the first mask 1210. The single opening 1211 may be a space surrounded by side walls of the first mask 1210.

A plurality of deposition holes 1221 may be arranged in the second mask 1220. The single opening 1211 may not be formed to communicate with only one of the deposition holes 1221, but may be formed to communicate with all of the neighboring deposition holes 1221 of the unit mask for deposition 1200a. The size of the single opening 1211 is greater than that of the plurality of the deposition holes 1221. In an exemplary embodiment, each second mask 1220 arranged above the single opening 1211 may be arranged spaced apart from the first mask 1210 corresponding to the base mask.

The mask for deposition 1200 having the above-described structure may be used to simultaneously fabricate a plurality of display devices. Furthermore, since the thickness of the second mask 1220 having the deposition holes 1221 is sufficiently thin, the shadow effect may be effectively reduced. In addition, since the portions 1212 of the first mask 1210 are not formed around each of the deposition holes 1221, the shadow effect may be further reduced. Accordingly, the mask for deposition 1200 is useful for an ultra-high-resolution deposition compared to the previous exemplary embodiments.

Figure 14:
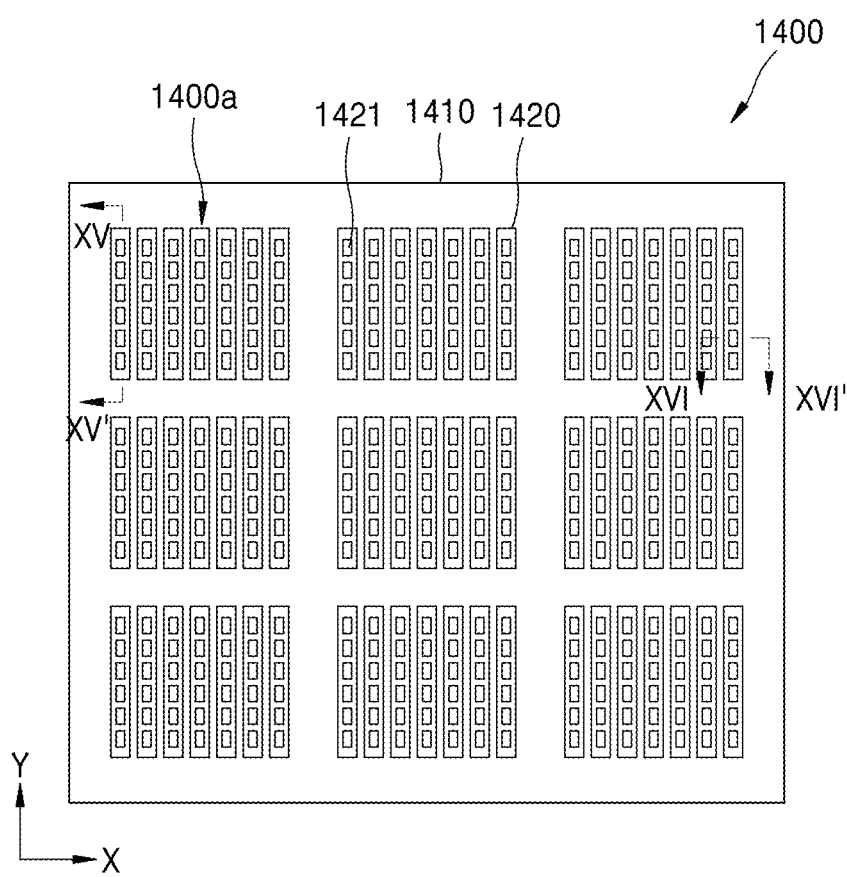
FIG. 14 is a plan view of still another exemplary embodiment of a mask for deposition according to the invention.
Figure 15:
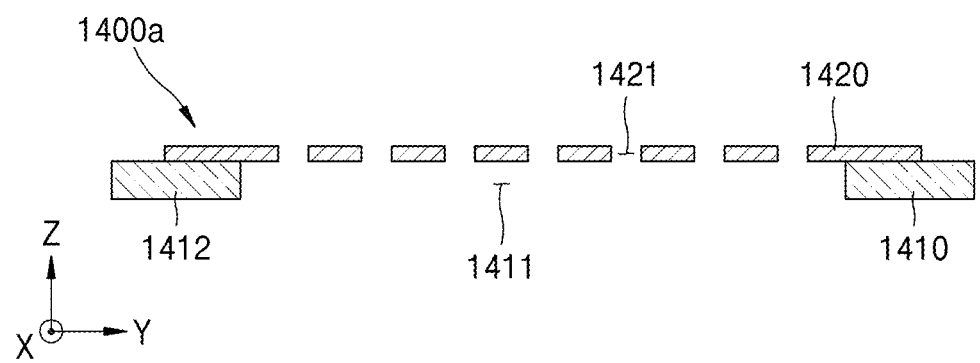
FIG. 15 is a cross-sectional view taken along line XV-XV' of FIG. 14.
Figure 16:
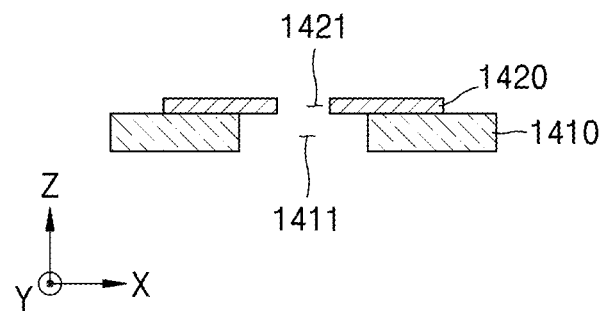
FIG. 16 is a cross-sectional view taken along line XVI-XVI' of FIG. 15.

FIG. 14 is a plan view of still another exemplary embodiment of a mask for deposition according to the invention. FIG. 15 is a cross-sectional view taken along line XV-XV' of FIG. 14. FIG. 16 is a cross-sectional view taken along line XVI-XVI' of FIG. 15.

Referring to FIGS. 14, 15, and 16, the mask for deposition 1400 may be a base mask. The mask for deposition 1400 may include a first mask 1410 and a plurality of second mask 1420 arranged on a surface of the first mask 1410.

The size of the first mask 1410 that is a lower mask may correspond to the size of the base mask. A plurality of openings 1411 may be arranged in an area corresponding to each unit display device. In the area corresponding to each unit display device, each of the second masks 1420 that is an upper mask may be arranged above a corresponding opening 1411.

The first mask 1410 and the second masks 1420 may overlap with each other in the direction (Z direction) perpendicular to the main surface of the mask for deposition 1400. The first mask 1410 may include an iron-nickel alloy. The second mask 1420 may include a metal layer and a metallic compound layer arranged on the metal layer. A top layer of the mask for deposition 1400 may be a metallic compound layer.

Unlike the mask for deposition 1400 of FIG. 12, to reinforce the mechanical strength, a plurality of openings 1411 may be formed in the mask for deposition 1400 and be spaced apart from each other in each area of the first mask 1410 corresponding to each unit display device.

Referring to a unit mask for deposition 1400a corresponding to one unit display device, the openings 1411 may be arranged in the first mask 1410. The openings 1411 may be arranged spaced apart from each other in a first horizontal direction (X direction) of the first mask 1410. Each of the openings 1411 may extend in a second horizontal direction (Y direction) of the first mask 1410 perpendicular to the first horizontal direction (X direction). Each of the openings 1411 may be surrounded by portions 1412 of the first mask 1410. Each of the openings 1411 may be a space surrounded by side walls of the first mask 1410.

The second masks 1420 arranged on the first mask 1410 corresponding to a unit display device may include a plurality of second masks. Each of the second masks 1420 may be arranged over each of the openings 1411. Each second mask 1420 may have a strip shape extending in the Y direction of the unit mask for deposition 1400a.

Each of the openings 1411 is arranged at each of a plurality of deposition holes 1421 in the first horizontal direction (X direction), and may communicate with all of the deposition holes 1421 neighboring in the second horizontal direction (Y direction) in the same second mask 1420. The size of each of the openings 1411 may be greater than that of all of the deposition holes 1421 in one second mask 1420. In an exemplary embodiment, the second masks 1420 may be arranged spaced apart from each other on the first mask 1410 corresponding to the base mask in the second horizontal direction (Y direction).

The mask for deposition 1400 having the above-described structure may be used to simultaneously fabricate a plurality of display devices. Furthermore, since the plurality of openings 1411 are formed in the unit mask for deposition 1400a, the mechanical strength may be enhanced.

Figure 17:
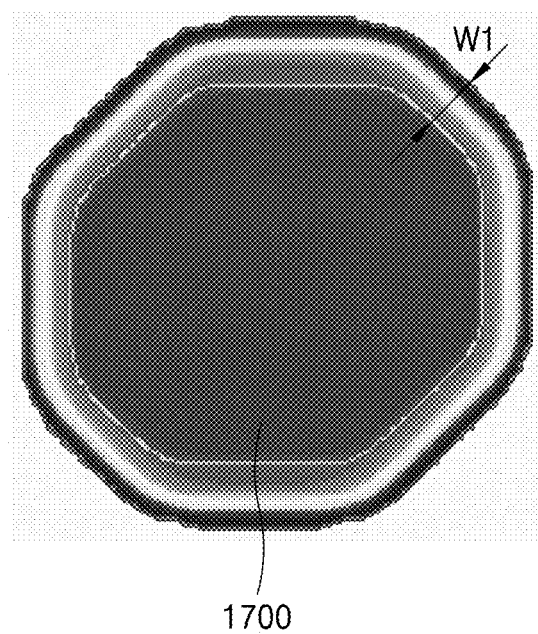
FIG. 17 is an image of a deposition pattern according to a comparative example.
Figure 18:
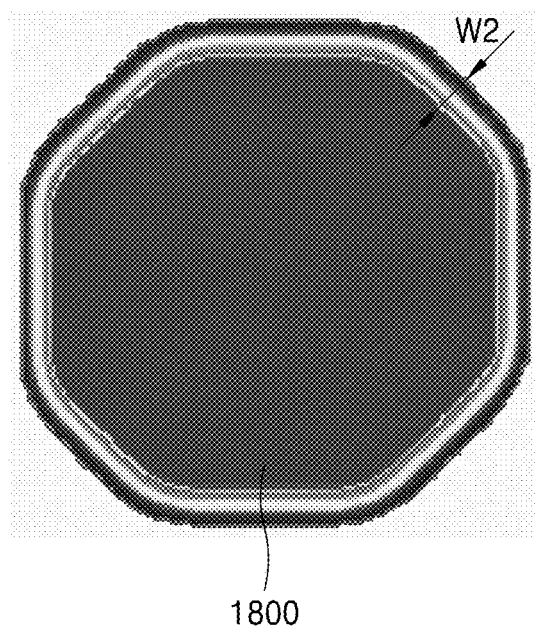
FIG. 18 is an image of a deposition pattern according to an exemplary embodiment of the invention.

FIG. 17 is an image of a deposition pattern 1700 according to a comparative example. FIG. 18 is an image of a deposition pattern 1800 according to an exemplary embodiment of the invention.

Each of the deposition patterns 1700 and 1800 may be an organic light-emitting layer deposited on a substrate.

Referring to FIG. 17, a mask for deposition according to a comparative example may be a mask having a single layer structure having a thickness of about 10 mm. The mask for deposition may include an iron-nickel alloy. A shadow having a first width w1 occurs around the deposition pattern 1700.

Referring to FIG. 18, a mask for deposition according to this exemplary embodiment may be a stacked structure. The first mask has a thickness of about 10 mm. The first mask may include an iron-nickel alloy. A second mask may be arranged on a first mask, and the second mask may include a metal layer and a metallic compound layer arranged on the metal layer. The second mask may have a thickness of about 1 mm. A shadow having a second width w2 occurs around the deposition pattern 1800.

It may be seen from the comparison between the comparative example and this exemplary embodiment according to the invention that the shadow effect is reduced in this exemplary embodiment. Accordingly, in the deposition pattern 1800 according to this exemplary embodiment, an emission area increases and a more precise pattern may be formed, compared to the deposition pattern 1700 according to the comparative example.

As described above, in the thin film deposition mask and the fabrication method thereof according to the inventive concept, a display device having a high resolution may be implemented.

Furthermore, the deposition holes of the mask for deposition may be precisely formed.

Furthermore, since a photomask, a dry process, and a wet process are used, processability may be stable and yield of a mask for deposition may be improved.

Furthermore, since a wet process is applied to the lower mask, a process margin may be very large.

It should be understood that exemplary embodiments described herein should be considered in a descriptive sense only and not for purposes of limitation. Descriptions of features or aspects within each exemplary embodiment should typically be considered as available for other similar features or advantages in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A mask for thin film deposition, comprising:
    a first mask which defines an opening; and
    a second mask on a surface of the first mask, and which defines a plurality of deposition holes and has a multilayer structure,
    wherein the opening and the plurality of deposition holes communicate with each other and provide a passage for a deposition material, a size of each of the plurality of deposition holes is smaller than a size of the opening, and each of the plurality of deposition holes has a shape corresponding to a deposition pattern to be patterned on a substrate,
    wherein the second mask comprises:
        a metallic compound layer disposed on an outermost side of the second mask, and
        a metal layer disposed between the first mask and the metallic compound layer,
    wherein the metallic compound layer includes a metal nitride, a metal carbide, or metal oxide, which is not included in the metal layer of the second mask.

2. The mask for thin film deposition of claim 1, wherein the first mask comprises an iron-nickel alloy.

3. The mask for thin film deposition of claim 1, wherein a thickness of the first mask is about 5 millimeters to about 30 millimeters.

4. The mask for thin film deposition of claim 1, wherein a thickness of the second mask is about 100 nanometers to about 2,000 nanometers.

5. The mask for thin film deposition of claim 1, wherein the second mask comprises a first surface facing the substrate and a second surface disposed in a direction opposite to the first surface and facing the first mask, and
    the plurality of deposition holes is arranged at positions corresponding to deposition patterns on the substrate in a direction perpendicular to the first surface.

6. The mask for thin film deposition of claim 5, wherein the opening comprises a plurality of openings, each of the plurality of openings is surrounded by portions of the first mask, each of the plurality of openings is arranged at a position corresponding to each of the plurality of deposition holes in the direction perpendicular to the first surface, and a size of each of the plurality of openings is greater than a size of each of the plurality of deposition holes.

7. The mask for thin film deposition of claim 6, wherein the opening is an area obtained by etching the first mask to a thickness of the first mask or more.

8. The mask for thin film deposition of claim 5, wherein a size of the first mask corresponds to a base mask,
    the opening is arranged in a first area corresponding to a unit display device, and
    the second mask is arranged in a second area corresponding to the unit display device.

9. The mask for thin film deposition of claim 8, wherein the opening comprises a single opening surrounded by portions of the first mask, the single opening communicates with all of the plurality of deposition holes in the second mask arranged in the second area, and a size of the single opening is greater than a size of each of the plurality of deposition holes.

10. The mask for thin film deposition of claim 5, wherein a size of the first mask corresponds to a base mask,
    the opening comprises a plurality of openings and the second mask comprises a plurality of second masks,
    the plurality of openings is arranged in a first area corresponding to a unit display device, and
    each of the plurality of the second masks is arranged in each of the plurality of openings in a second area corresponding to the unit display device.

11. The mask for thin film deposition of claim 10, wherein the plurality of openings is spaced apart from each other in a first horizontal direction of the first mask and extends in a second horizontal direction perpendicular to the first horizontal direction, each of the plurality of openings is surrounded by portions of the first mask, the first and second horizontal directions defines a plane of the surface of the first mask, and
    each of the plurality of openings communicates with a corresponding one of the deposition holes in the first horizontal direction, and communicates with all of the deposition holes, neighboring in the second horizontal direction, in each of the second mask.

* * * * *